(12) United States Patent
Yokoyama et al.

(10) Patent No.: US 8,044,382 B2
(45) Date of Patent: Oct. 25, 2011

(54) LIGHT-EMITTING DEVICE AND METHOD FOR MANUFACTURING THE SAME

(75) Inventors: Shin Yokoyama, Higashihiroshima (JP); Yoshiteru Amemiya, Higashihiroshima (JP)

(73) Assignee: Hiroshima University, Hiroshima (JP)

( * ) Notice: Subject to any disclaimer, the term of this patent is extended or adjusted under 35 U.S.C. 154(b) by 148 days.

(21) Appl. No.: 12/601,794

(22) PCT Filed: Mar. 26, 2008

(86) PCT No.: PCT/JP2008/000744
§ 371 (c)(1), (2), (4) Date: Nov. 24, 2009

(87) PCT Pub. No.: WO2009/118784
PCT Pub. Date: Oct. 1, 2009

(65) Prior Publication Data
US 2010/0176370 A1     Jul. 15, 2010

(51) Int. Cl.
| | |
|---|---|
| H01L 29/06 | (2006.01) |
| H01L 31/0328 | (2006.01) |
| H01L 31/0336 | (2006.01) |
| H01L 31/072 | (2006.01) |
| H01L 31/109 | (2006.01) |
| H01L 27/15 | (2006.01) |
| H01L 29/26 | (2006.01) |
| H01L 31/12 | (2006.01) |
| H01L 33/00 | (2010.01) |
| H01L 21/331 | (2006.01) |
| H01L 21/00 | (2006.01) |

(52) U.S. Cl. ......... 257/13; 257/9; 257/14; 257/79; 257/E29.071; 438/378; 438/795; 438/962; 977/720; 977/721; 977/774

(58) Field of Classification Search ........ 257/9, 13, 257/14, 79, E29.071; 438/378, 795, 962, 438/FOR. 407, FOR. 408; 977/720, 721, 977/774
See application file for complete search history.

(56) References Cited

U.S. PATENT DOCUMENTS
7,172,956 B2 * 2/2007 Hori et al. .......... 438/602
(Continued)

FOREIGN PATENT DOCUMENTS
JP    09-102596    4/1997
(Continued)

OTHER PUBLICATIONS
International Search Report for PCT/JP2008/000744, mailed May 27, 2008.

*Primary Examiner* — Ida M Soward
(74) *Attorney, Agent, or Firm* — Foley & Lardner LLP

(57) ABSTRACT

A light-emitting device includes an n-type silicon thin film (2), a silicon thin film (3), and a p-type silicon thin film (4). The silicon thin film (3) is formed on the n-type silicon thin film (2) and the p-type silicon thin film (4) is formed on the silicon thin film (3). The n-type silicon thin film (2), the silicon thin film (3), and the p-type silicon thin film (4) form a pin junction. The n-type silicon thin film (2) includes a plurality of quantum dots (21) composed of n-type Si. The silicon thin film (3) includes a plurality of quantum dots (31) composed of p-type Si. The p-type silicon thin film (4) includes a plurality of quantum dots (41) composed of p-type Si. Electrons are injected from the n-type silicon thin film (2) side and holes are injected from the p-type silicon thin film (4) side, whereby light is emitted at a silicon nitride film (3).

12 Claims, 14 Drawing Sheets

U.S. PATENT DOCUMENTS

| | | | |
|---|---|---|---|
| 7,265,374 B2 * | 9/2007 | Lee et al. | 257/13 |
| 7,279,716 B2 * | 10/2007 | Chen | 257/94 |
| 7,326,908 B2 * | 2/2008 | Sargent et al. | 250/214.1 |
| 7,372,067 B2 * | 5/2008 | Todori et al. | 257/14 |
| 7,473,922 B2 * | 1/2009 | Uchiyama et al. | 257/14 |
| 7,592,618 B2 * | 9/2009 | Khang et al. | 257/13 |
| 2003/0021982 A1 * | 1/2003 | Kotov | 428/323 |
| 2003/0157325 A1 * | 8/2003 | Anders et al. | 428/402 |
| 2005/0064618 A1 * | 3/2005 | Brown et al. | 438/49 |
| 2008/0007156 A1 * | 1/2008 | Gibson et al. | 313/503 |
| 2010/0019261 A1 * | 1/2010 | Scianna et al. | 257/98 |
| 2010/0258189 A1 * | 10/2010 | Curran | 136/263 |

FOREIGN PATENT DOCUMENTS

| | | |
|---|---|---|
| JP | 11-266055 | 9/1999 |
| JP | 2003-332695 | 11/2003 |
| JP | 2005-347465 | 12/2005 |
| JP | 2006-225258 | 8/2006 |
| JP | 2006-228916 | 8/2006 |
| JP | 2007-088311 | 4/2007 |

* cited by examiner

FIG. 10
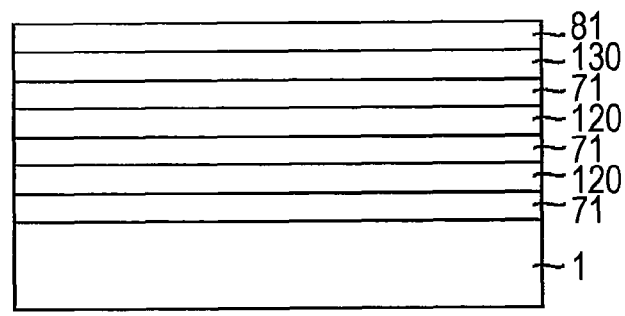
(f)
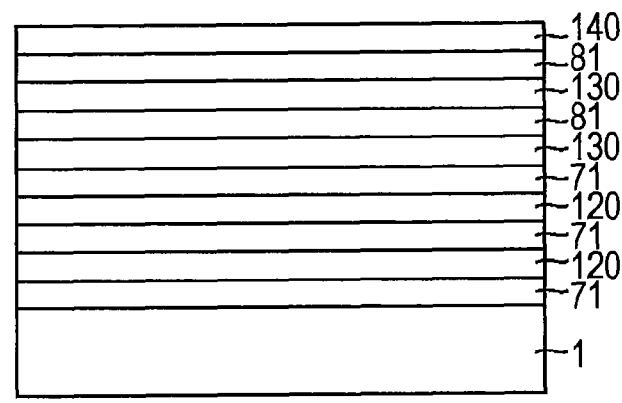
(g)
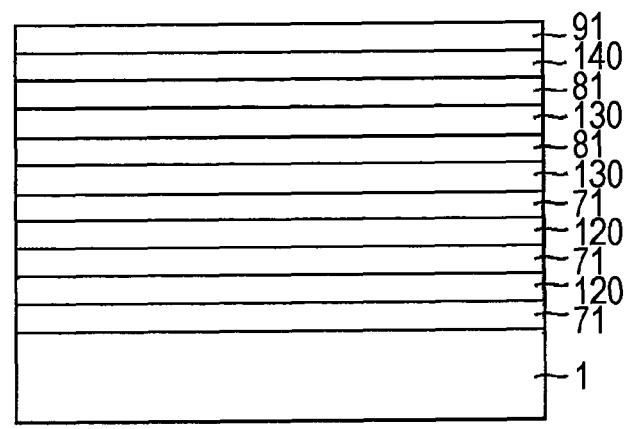
(h)

FIG. 11
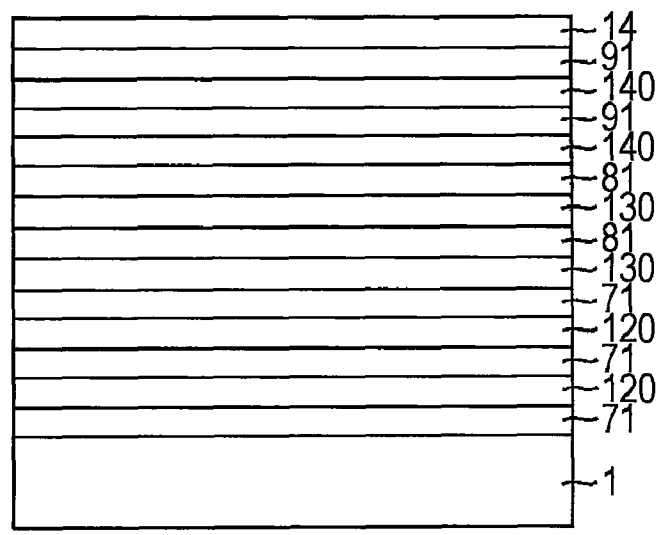
(i)
P+  P+  P+
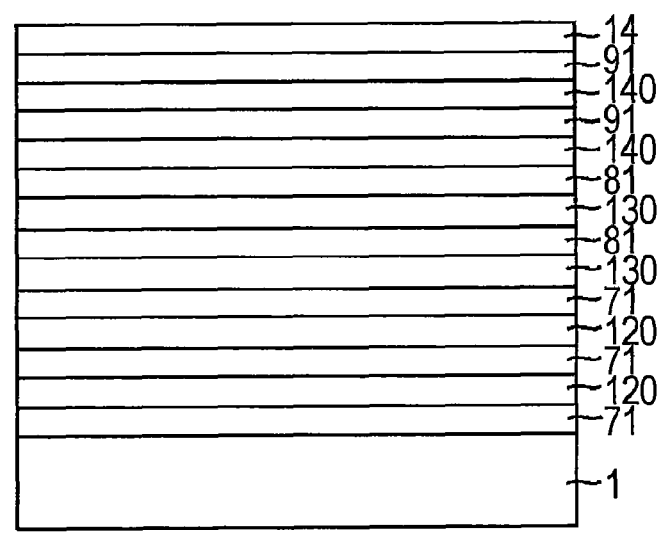
(j)

FIG. 12
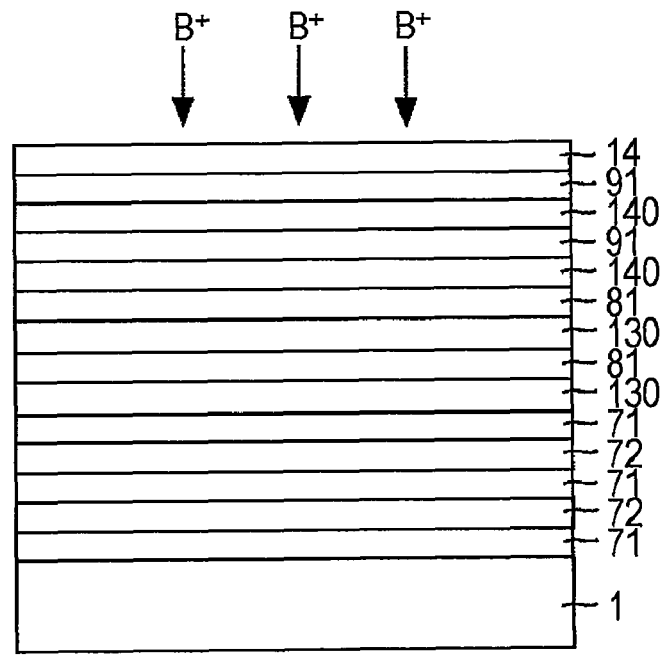
(k)
HEAT TREATMENT
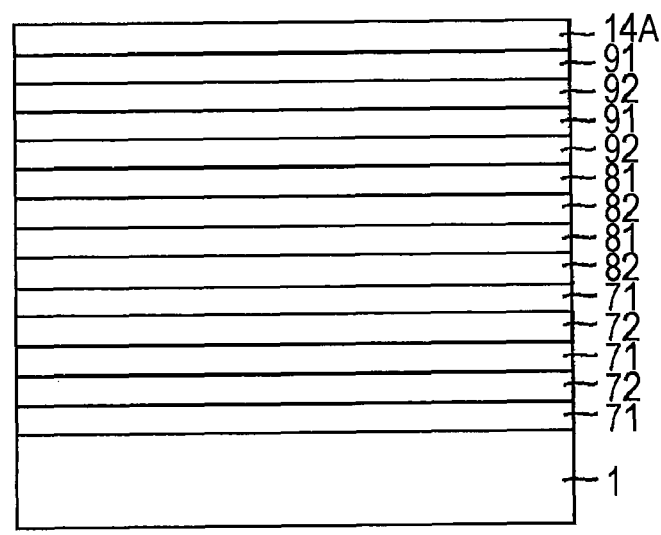
(l)

FIG. 13
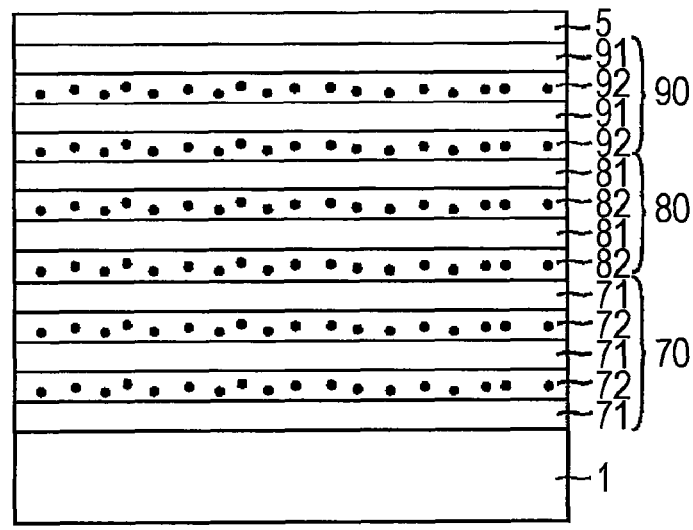
(m)
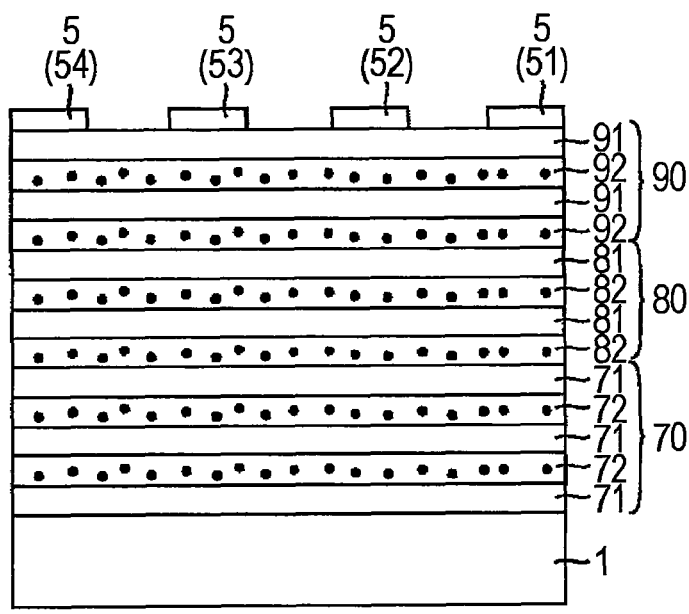
(n)

(p)

though he is a U.S. national stage application
LIGHT-EMITTING DEVICE AND METHOD FOR MANUFACTURING THE SAME

CROSS-REFERENCE TO RELATED APPLICATIONS

The present application is a U.S. national stage application claiming the benefit of International Application No. PCT/JP2008/000744, filed on Mar. 26, 2008, the entire contents of which is incorporated herein by reference in its entirety.

TECHNICAL FIELD

The present invention relates to a light-emitting device and a method for manufacturing the light-emitting device, and particularly to a light-emitting device using quantum dots and a method for manufacturing the light-emitting device.

BACKGROUND ART

Semiconductor light-emitting devices using a semiconductor island structure (quantum dot) has been known (Japanese Unexamined Patent Application Publication No. 2003-332695). Such a semiconductor light-emitting device has a structure of n-type AlGaAs/n-type GaAs/InGaAs island structure/nitrogen-containing compound semiconductor/p-type GaAs/p-type AlGaAs.

An InGaAs island structure has internal stress that comes from compressive stress. The nitrogen-containing compound semiconductor has tensile stress. Thus, the internal stress of the InGaAs island structure is reduced by disposing the nitrogen-containing compound semiconductor on the InGaAs island structure.

As a result, the internal stress of the InGaAs island structure, which is a light-emitting layer, is reduced and an emission spectrum of 1.55 µm is achieved at room temperature.

DISCLOSURE OF INVENTION

However, a known semiconductor light-emitting device is formed on an expensive compound semiconductor substrate by heteroepitaxial growth, which is an advanced technology. This incurs high costs compared with a device that uses a silicon substrate. Furthermore, a known light-emitting device that uses silicon dots has lower light-emitting efficiency than a light-emitting device that uses a direct transition compound semiconductor.

In view of the foregoing problems, an object of the present invention is to provide a light-emitting device whose light-emitting efficiency can be improved.

Another object of the present invention is to provide a method for manufacturing the light-emitting device whose light-emitting efficiency can be improved.

According to the present invention, a light-emitting device includes first to third conductive members. The first conductive member includes a first quantum dot of a first conduction type. The second conductive member includes a second quantum dot and is disposed on the first conductive member. The third conductive member includes a third quantum dot of a second conduction type that is different from the first conduction type and is disposed on the second conductive member. The third conductive member has a higher barrier energy against electrons than the second conductive member.

The first conductive member preferably includes a plurality of the first quantum dots and a first insulating layer in which a tunneling current flows. The second conductive member preferably includes a plurality of the second quantum dots and a second insulating layer in which a tunneling current flows. The third conductive member preferably includes a plurality of the third quantum dots and a third insulating layer in which a tunneling current flows.

Preferably, the plurality of first quantum dots are irregularly arranged in a thickness direction of the first conductive member, the plurality of second quantum dots are irregularly arranged in a thickness direction of the second conductive member, and the plurality of third quantum dots are irregularly arranged in a thickness direction of the third conductive member.

The first conduction type is preferably an n-type and the second conduction type is preferably a p-type.

In the first conductive member, a barrier energy against holes is preferably higher than a barrier energy against electrons. In the third conductive member, a barrier energy against electrons is preferably higher than a barrier energy against holes.

The first to third quantum dots are preferably composed of silicon dots. The first conductive member is preferably composed of a silicon oxide film containing a larger amount of silicon than $SiO_2$. The second conductive member is preferably composed of a silicon nitride film containing a larger amount of silicon than $Si_3N_4$. The third conductive member is preferably composed of a silicon oxynitride film containing a larger amount of silicon than $SiO_xN_{(4/3-2x/3)}$ ($0<x<2$).

According to the present invention, a light-emitting device includes a light-emitting layer, a first conductive member, and a second conductive member. The light-emitting layer includes a quantum dot. The first conductive member supplies an electron to the light-emitting layer through an n-type quantum dot. The second conductive member supplies a hole to the light-emitting layer through a p-type quantum dot.

The first conductive member is preferably composed of a silicon oxide film containing a larger amount of silicon than $SiO_2$. The second conductive member is preferably composed of a silicon oxynitride film containing a larger amount of silicon than $SiO_xN_{(4/3-2x/3)}$ ($0<x<2$).

According to the present invention, a method for manufacturing a light-emitting device includes a first step of depositing a first conductive member including a quantum dot on one principal surface of a semiconductor substrate; a second step of depositing a second conductive member including a quantum dot on the first conductive member; a third step of depositing a third conductive member including a quantum dot on the second conductive member; a fourth step of introducing an impurity of a first conduction type into the first conductive member; a fifth step of introducing an impurity of a second conduction type that is different from the first conduction type into the third conductive member; and a sixth step of heat-treating the first conductive member including the impurity of the first conduction type and the third conductive member including the impurity of the second conduction type.

In the first step, the first conductive member composed of a silicon oxide film containing a larger amount of silicon than $SiO_2$ is preferably deposited on the principal surface by adjusting a flow rate ratio of a second material gas including silicon to a first material gas including oxygen to a first standard flow rate ratio or more. In the second step, the second conductive member composed of a silicon nitride film containing a larger amount of silicon than $Si_3N_4$ is preferably deposited on the first conductive member by adjusting a flow rate ratio of the second material gas to a third material gas including nitrogen to a second standard flow rate ratio or more. In the third step, the third conductive member composed of a silicon oxynitride film containing a larger amount of silicon than $SiO_xN_{(4/3-2x/3)}$ ($0<x<2$) is preferably deposited on the second conductive member by adjusting a flow rate ratio of the second material gas to the first material gas to the first standard flow rate ratio or more and by adjusting a flow rate ratio of the second material gas to the third material gas to the second standard flow rate ratio or more.

In the fourth step, an n-type impurity is preferably introduced into the first conductive member. In the fifth step, a p-type impurity is preferably introduced into the third conductive member.

In the sixth step, the first conductive member including the n-type impurity and the third conductive member including the p-type impurity are preferably heat-treated in a nitrogen atmosphere.

In the light-emitting device according to the present invention, one of electrons and holes are supplied to the second conductive member through one of quantum dots included in the first conductive member and quantum dots included in the third conductive member, and the other of electrons and holes are supplied to the second conductive member through the other of quantum dots included in the first conductive member and quantum dots included in the third conductive member. The electrons and holes supplied to the second conductive member are confined in the second conductive member and recombine with each other to emit light. That is to say, in the light-emitting device according to the present invention, light is emitted by supplying both the electrons and holes to the second conductive member.

Thus, the present invention can increase light-emitting efficiency.

BRIEF DESCRIPTION OF DRAWINGS

FIG. 10 is a second process diagram for describing a method for manufacturing the semiconductor device shown in FIG. 8.

FIG. 11 is a third process diagram for describing a method for manufacturing the semiconductor device shown in FIG. 8.

FIG. 12 is a fourth process diagram for describing a method for manufacturing the semiconductor device shown in FIG. 8.

FIG. 13 is a fifth process diagram for describing a method for manufacturing the semiconductor device shown in FIG. 8.

BEST MODES FOR CARRYING OUT THE INVENTION

Figure 1:
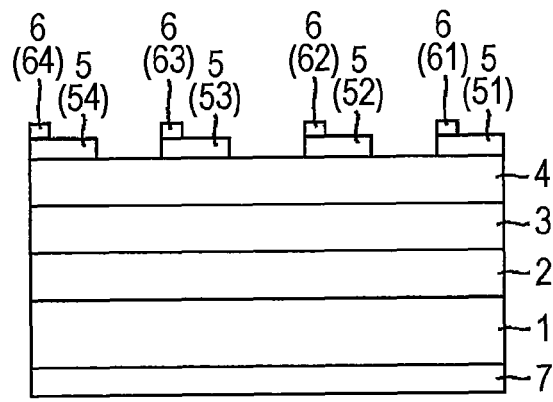
FIG. 1 is a sectional view of a light-emitting device according to an embodiment of the present invention.

An embodiment of the present invention will be described in detail with reference to the drawings. The same or corresponding parts in the drawings are designated by the same reference numerals, and the descriptions are not repeated.

FIG. 1 is a sectional view of a light-emitting device according to an embodiment of the present invention. Referring to FIG. 1, a light-emitting device 10 according to an embodiment of the present invention includes a substrate 1, an n-type silicon thin film 2, a silicon thin film 3, a p-type silicon thin film 4, a $p^+$-type polysilicon (poly-Si) film 5, and electrodes 6 and 7.

The substrate 1 is made of $n^+$-type silicon ($n^+$-Si) with a resistivity of about 0.1 Ω·cm. The n-type silicon thin film 2 into which n-type impurities are introduced contains an oxygen element (O) and a larger amount of Si than $SiO_2$. Specifically, the n-type silicon thin film 2 includes a plurality of quantum dots composed of n-type Si and a silicon oxide film and is formed on one principal surface of the substrate 1 as described below. The n-type silicon thin film 2 has a thickness of about 150 nm.

The silicon thin film 3 contains a nitrogen element (N) and a larger amount of Si than $Si_3N_4$ as described below. Specifically, the silicon thin film 3 includes a plurality of quantum dots composed of Si and a silicon nitride film and is formed on the n-type silicon thin film 2. The silicon thin film 3 has a thickness of about 10 nm.

The p-type silicon thin film 4 is formed on the silicon thin film 3. The p-type silicon thin film 4 into which p-type impurities are introduced contains an oxygen element (O), a nitrogen element (N), and a larger amount of Si than $SiO_2$ and $Si_3N_4$. Specifically, the p-type silicon thin film 4 includes a plurality of quantum dots composed of p-type Si and a silicon oxynitride film and has a composition of $SiO_1N_{0.33}$ as described below. The p-type silicon thin film 4 has a thickness of about 100 nm.

The $p^+$-type poly-Si film 5 is constituted by $p^+$-type poly-Si films 51 to 54 and formed on the p-type silicon thin film 4. The $p^+$-type poly-Si film 5 has a boron concentration of about $10^{20}$ $cm^{-3}$ and a thickness of about 50 nm.

The electrode 6 is constituted by electrodes 61 to 64, which are formed on the $p^+$-type poly-Si films 51 to 54, respectively. Each of the electrodes 61 to 64 is made of aluminum (Al).

The electrode 7 made of Al is formed on the back surface of the substrate 1 (a surface opposite to the surface on which the n-type silicon thin film 2, etc. are formed).

Figure 2:
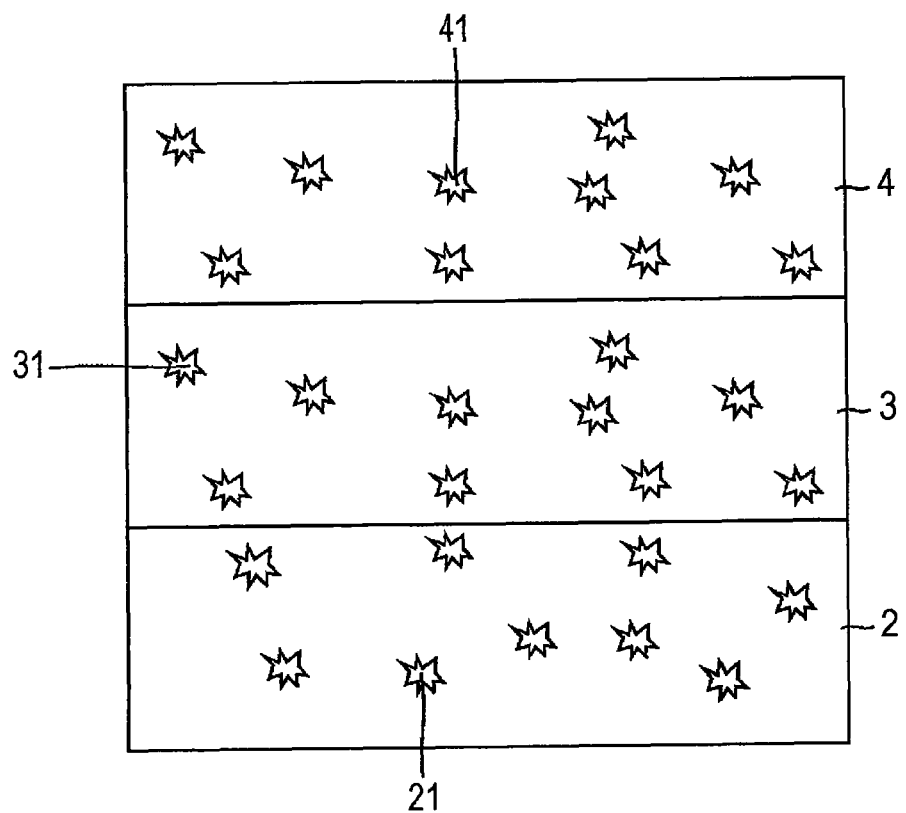
FIG. 2 is an enlarged sectional view of an n-type silicon oxide film, a silicon thin film, and a p-type silicon thin film shown in FIG. 1.

FIG. 2 is an enlarged sectional view of the n-type silicon thin film 2, the silicon thin film 3, and the p-type silicon thin film 4 shown in FIG. 1. Referring to FIG. 2, the n-type silicon thin film 2 includes a plurality of quantum dots 21, each of which is composed of an n-type Si dot and has a phosphorus (P) concentration of about $10^{19}$ $cm^{-3}$. The plurality of quantum dots 21 are irregularly arranged in the n-type silicon thin film 2.

The silicon thin film 3 includes a plurality of quantum dots 31. The plurality of quantum dots 31 are irregularly arranged in the silicon thin film 3.

The p-type silicon thin film 4 includes a plurality of quantum dots 41, each of which is composed of a p-type Si dot and has a B concentration of about $10^{19}$ $cm^{-3}$. The plurality of quantum dots 41 are irregularly arranged in the p-type silicon thin film 4.

As described above, the n-type silicon thin film 2, the silicon thin film 3, and the p-type silicon thin film 4 include the quantum dots 21 each composed of an n-type Si dot, the quantum dots 31 each composed of a Si dot, and the quantum dots 41 each composed of a p-type Si dot, respectively. Thus, the n-type silicon thin film 2, the silicon thin film 3, and the p-type silicon thin film 4 form a pin junction.

Each of the quantum dots 21, 31, and 41 has a diameter of 1 to 10 nm.

Figure 3:
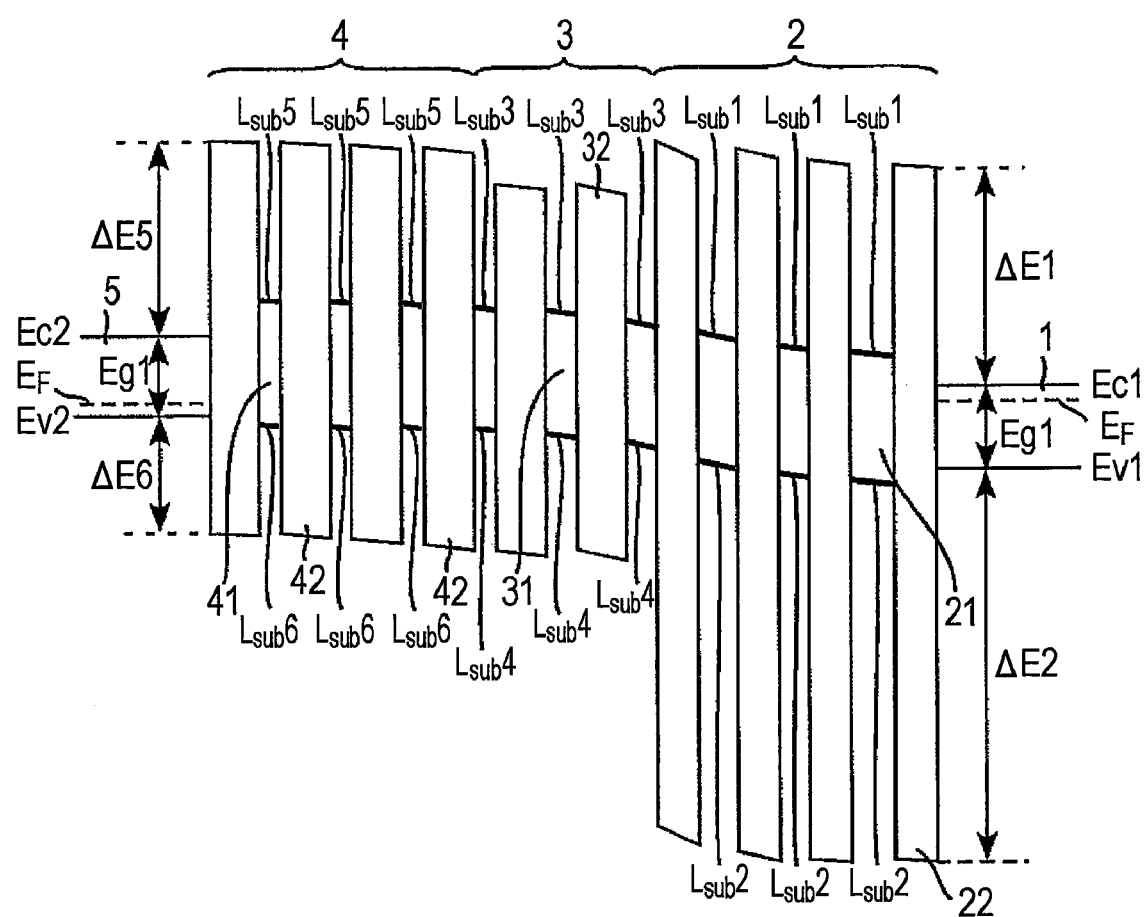
FIG. 3 is an energy band diagram, at zero bias, of the light-emitting device shown in FIG. 1.

FIG. 3 is an energy band diagram, at zero bias, of the light-emitting device 10 shown in FIG. 1. Referring to FIG. 3, a conduction band Ec1 and a valence band Ev1 are present in $n^+$ Si constituting the substrate 1, and $n^+$ Si has an energy band gap Eg1 of 1.12 eV.

A conduction band Ec2 and a valence band Ev2 are present in the $p^+$ poly-Si film 5, and the $p^+$ poly-Si film 5 has an energy band gap Eg1 of 1.12 eV.

Since $n^+$ Si constituting the substrate 1 is doped with high-concentration P and the $p^+$ poly-Si film 5 is doped with high-concentration B, the energy level of the conduction band Ec1 edge of $n^+$ Si is close to that of the valence band Ev2 edge of the $p^+$ poly-Si film 5.

Since the n-type silicon thin film 2 includes the plurality of quantum dots 21 as described above, it has a layered structure composed of the quantum dots 21 and silicon dioxide ($SiO_2$) layers 22 not including the quantum dots 21. As a result, each of the quantum dots 21 is sandwiched by the $SiO_2$ layers 22.

The $SiO_2$ layers 22 have a thickness that allows a tunneling current to flow and have an energy band gap of about 9 eV. Since each of the quantum dots 21 is sandwiched by two of the $SiO_2$ layers 22, it has a sub-level $L_{sub}1$ on the conduction band Ec1 side of $n^+$ Si and a sub-level $L_{sub}2$ on the valence band Ev1 side of $n^+$ Si due to a quantum size effect.

The sub-level $L_{sub}1$ is higher than the energy level of the conduction band Ec1 of $n^+$ Si and the sub-level $L_{sub}2$ is higher than the energy level of the valence band Ev1 edge of $n^+$ Si. As a result, the energy difference between the sub-level $L_{sub}1$ and the sub-level $L_{sub}2$ is larger than the energy gap Eg1 of $n^+$ Si.

The energy difference $\Delta E1$ between the conduction band Ec1 edge of $n^+$ Si and the conduction band edge of the $SiO_2$ layers 22 is about 3.23 eV, and the energy difference $\Delta E2$ between the valence band Ev1 edge of $n^+$ Si and the valence band edge of the $SiO_2$ layers 22 is about 4.65 eV. Thus, the n-type silicon thin film 2 has a barrier energy ($=\Delta E1$) against electrons in $n^+$ Si. The barrier energy ($=\Delta E1$) is lower than a barrier energy ($=\Delta E2$) against holes in $n^+$ Si.

Since the silicon thin film 3 includes the plurality of quantum dots 31 as described above, it has a layered structure composed of the quantum dots 31 and silicon nitride ($Si_3N_4$) layers 32 not including the quantum dots 31. As a result, each of the quantum dots 31 is sandwiched by the $Si_3N_4$ layers 32.

The $Si_3N_4$ layers 32 have a thickness that allows a tunneling current to flow and have an energy band gap of about 5.2 eV. Since each of the quantum dots 31 is sandwiched by two of the $Si_3N_4$ layers 32, it has a sub-level $L_{sub}3$ on the conduction band Ec2 side of the $p^+$ poly-Si film 5 and a sub-level $L_{sub}4$ on the valence band Ev4 side of the $p^+$ poly-Si film 5 due to the quantum size effect.

The sub-level $L_{sub}3$ is higher than the energy level of the conduction band Ec2 edge of the $p^+$ poly-Si film 5 and the sub-level $L_{sub}4$ is higher than the energy level of the valence band Ev2 edge of the $p^+$ poly-Si film 5. As a result, the energy difference between the sub-level $L_{sub}3$ and the sub-level $L_{sub}4$ is larger than the energy gap Eg1 of the $p^+$ poly-Si film 5.

Since the p-type silicon thin film 4 includes the plurality of quantum dots 41 as described above, it has a layered structure composed of the quantum dots 41 and silicon oxynitride layers 42 not including the quantum dots 41. As a result, each of the quantum dots 41 is sandwiched by the silicon oxynitride layers 42.

The silicon oxynitride layers 42 have a thickness that allows a tunneling current to flow, a composition of $SiO_xN_{(4/3-2x/3)}$ (0<x<2), and an energy band gap of about 5.2 to 9 eV. Since each of the quantum dots 41 is sandwiched by two of the silicon oxynitride layers 42, it has a sub-level $L_{sub}5$ on the conduction band Ec2 side of $p^+$ Si and a sub-level $L_{sub}6$ on the valence band Ev2 side of $p^+$ Si due to the quantum size effect.

The sub-level $L_{sub}5$ is higher than the energy level of the conduction band Ec2 of $p^+$ Si and the sub-level $L_{sub}6$ is higher than the energy level of the valence band Ev2 edge of $p^+$ Si. As a result, the energy difference between the sub-level $L_{sub}5$ and the sub-level $L_{sub}6$ is larger than the energy gap Eg1 of $p^+$ Si.

The energy difference $\Delta E5$ between the conduction band Ec2 edge of $p^+$ Si and the conduction band edge of the silicon oxynitride layers 42 is 2.32 to 3.2 eV, and the energy difference $\Delta E6$ between the valence band Ev2 edge of $p^+$ Si and the valence band edge of the silicon oxynitride layers 42 is about 1.78 to 4.65 eV. The silicon oxynitride layers 42 satisfying $\Delta E5<\Delta E6$ can be formed by adjusting the composition ratio. Thus, the p-type silicon thin film 4 has a barrier energy ($=\Delta E6$) against holes in $p^+$ Si. The barrier energy ($=\Delta E6$) is lower than a barrier energy ($=\Delta E5$) against electrons in $p^+$ Si.

Figure 4:
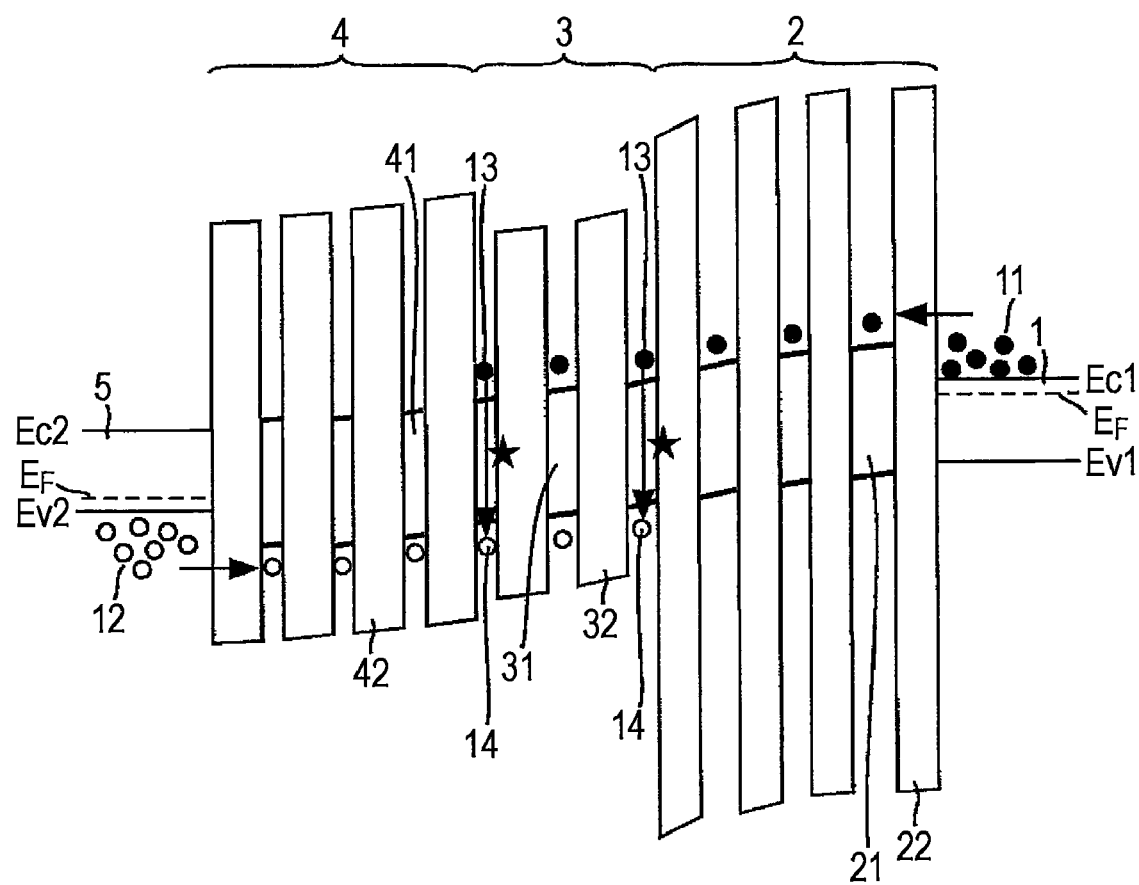
FIG. 4 is an energy band diagram of the light-emitting device shown in FIG. 1 when an electric current is applied.

FIG. 4 is an energy band diagram of the light-emitting device 10 shown in FIG. 1 when an electric current is applied. When, assuming that the electrode 6 side is positive and the electrode 7 side is negative, a voltage is applied between the electrodes 6 and 7, the energy band of $n^+$ Si constituting the substrate 1 is raised as shown in FIG. 4. Consequently, electrons 11 in $n^+$ Si conduct in the n-type silicon thin film 2 through the plurality of quantum dots 21 included in the n-type silicon thin film 2, and are injected into the silicon thin film 3.

Since the p-type silicon thin film 4 has a higher barrier against electrons than the silicon thin film 3, the electrons injected into the silicon thin film 3 are blocked by the p-type silicon thin film 4 and stored in the quantum dots 31 of the silicon thin film 3.

On the other hand, holes 12 in the $p^+$ poly-Si film 5 conduct in the p-type silicon thin film 4 through the quantum dots 41 included in the p-type silicon thin film 4, and are injected into the silicon thin film 3. Since the n-type silicon thin film 2 has a higher barrier against holes than the silicon thin film 3, the holes injected into the silicon thin film 3 are blocked by the n-type silicon thin film 2 and stored in the quantum dots 31 of the silicon thin film 3.

Thus, electrons 13 stored in the quantum dots 31 and holes 14 stored in the quantum dots 31 recombine with each other to emit light.

In the light-emitting device 10, the electrons injected into the silicon thin film 3 from the $n^+$ Si 1 are confined in the silicon thin film 3 by the p-type silicon thin film 4, while at the same time the holes injected into the silicon thin film 3 from the $p^+$ poly-Si film 5 are confined in the silicon thin film 3 by the n-type silicon thin film 2. That is to say, in the light-emitting device 10, both the holes and electrons are confined in the p-type silicon thin film 3. As a result, light-emitting efficiency of the light-emitting device 10 can be increased.

Furthermore, the n-type silicon thin film 2, the silicon thin film 3, and the p-type silicon thin film 4 irregularly include the plurality of quantum dots 21, the plurality of quantum dots 31, and the plurality of quantum dots 41, respectively. Therefore, the injection efficiency of electrons and holes is improved due to the electric-field enhancement effect at the protruding portions of the quantum dots 21, 31, and 41 each having an irregular shape.

Thus, the present invention can increase light-emitting efficiency.

Figure 5:
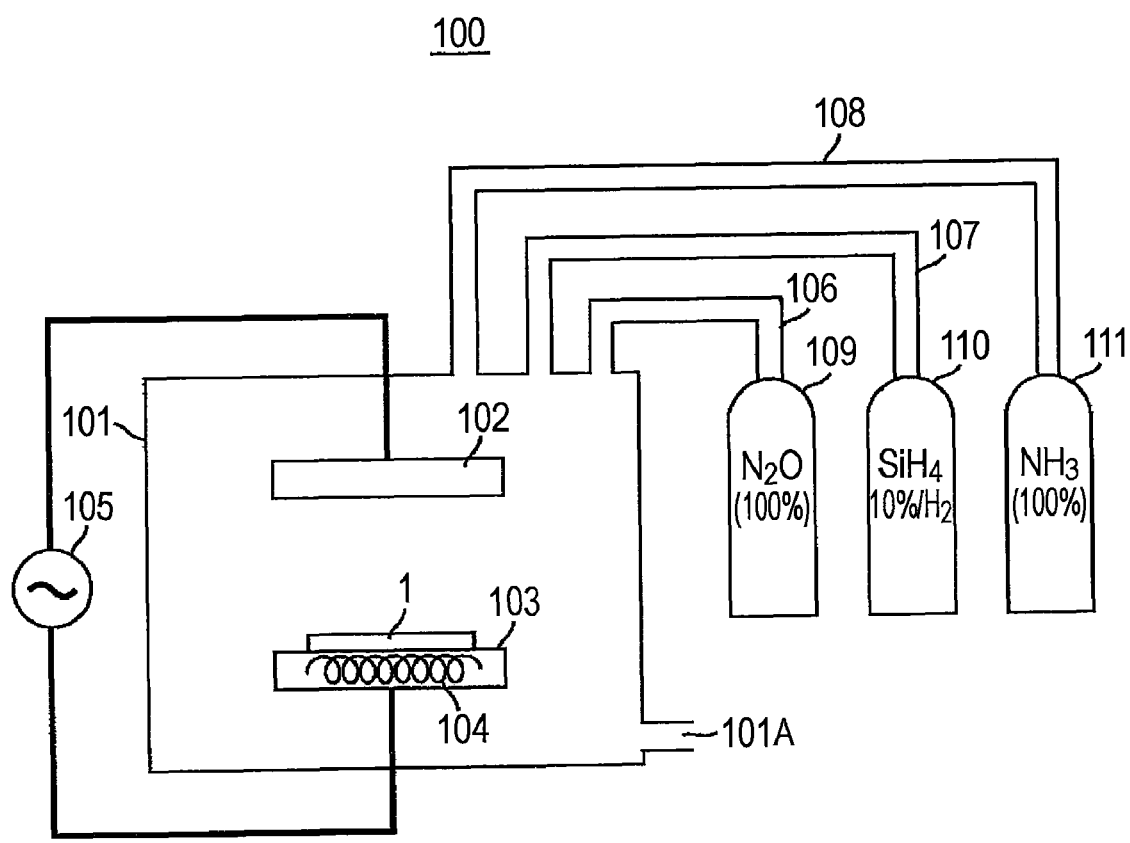
FIG. 5 is a schematic view of a plasma chemical vapor deposition (CVD) apparatus used for manufacturing the light-emitting device shown in FIG. 1.

FIG. 5 is a schematic view of a plasma chemical vapor deposition (CVD) apparatus used for manufacturing the light-emitting device 10 shown in FIG. 1. Referring to FIG. 5, a plasma CVD apparatus 100 includes a reaction chamber 101, an electrode plate 102, a sample holder 103, a heater 104, a radio frequency (RF) power supply 105, pipes 106 to 108, and gas cylinders 109 to 111.

The reaction chamber 101 is a hollow container and has an outlet 101A. The electrode plate 102 and the sample holder 103 are plate-shaped and disposed in the reaction chamber 101 so as to be spaced 50 mm apart and substantially parallel. Each of the electrode plate 102 and the sample holder 103 has a diameter of 200 mmφ. The heater 104 is disposed in the sample holder 103.

The RF power supply 105 is connected to the electrode plate 102 and the sample holder 103. The pipe 106 has one end connected to the reaction chamber 101 and the other end connected to the gas cylinder 109. The pipe 107 has one end connected to the reaction chamber 101 and the other end connected to the gas cylinder 110. The pipe 108 has one end connected to the reaction chamber 101 and the other end connected to the gas cylinder 111.

The sample holder 103 holds a substrate 1. The heater 104 heats the substrate 1 to a desired temperature. The RF power supply 105 applies an RF power of 13.56 MHz between the electrode plate 102 and the sample holder 103.

The gas cylinders 109, 110, and 111 hold a $N_2O$ (100%) gas, a 10% $SiH_4$ gas diluted with a hydrogen ($H_2$) gas, and an $NH_3$ (100%) gas, respectively.

The $N_2O$ gas, the $SiH_4$ gas, and the $NH_3$ gas are supplied to the reaction chamber 101 through the pipes 106, 107, and 108, respectively. The $N_2O$ gas, the $SiH_4$ gas, and the $NH_3$ gas supplied to the reaction chamber 101 are exhausted through the outlet 101A using an exhaust device (not shown) such as a rotary pump. As a result, a desired pressure is achieved in the reaction chamber 101.

In the plasma CVD apparatus 100, a silicon-rich oxide film is deposited on the substrate 1 by applying the RF power between the electrode plate 102 and the sample holder 103 using the RF power supply 105 while the $N_2O$ gas and the $SiH_4$ gas are supplied to the reaction chamber 101. In the plasma CVD apparatus 100, a silicon-rich nitride film is also deposited on the substrate 1 by applying the RF power between the electrode plate 102 and the sample holder 103 using the RF power supply 105 while the $NH_3$ gas and the $SiH_4$ gas are supplied to the reaction chamber 101. Moreover, in the plasma CVD apparatus 100, a silicon-rich oxynitride film is deposited on the substrate 1 by applying the RF power between the electrode plate 102 and the sample holder 103 using the RF power supply 105 while the $N_2O$ gas, the $NH_3$ gas, and the $SiH_4$ gas are supplied to the reaction chamber 101.

Figure 6:
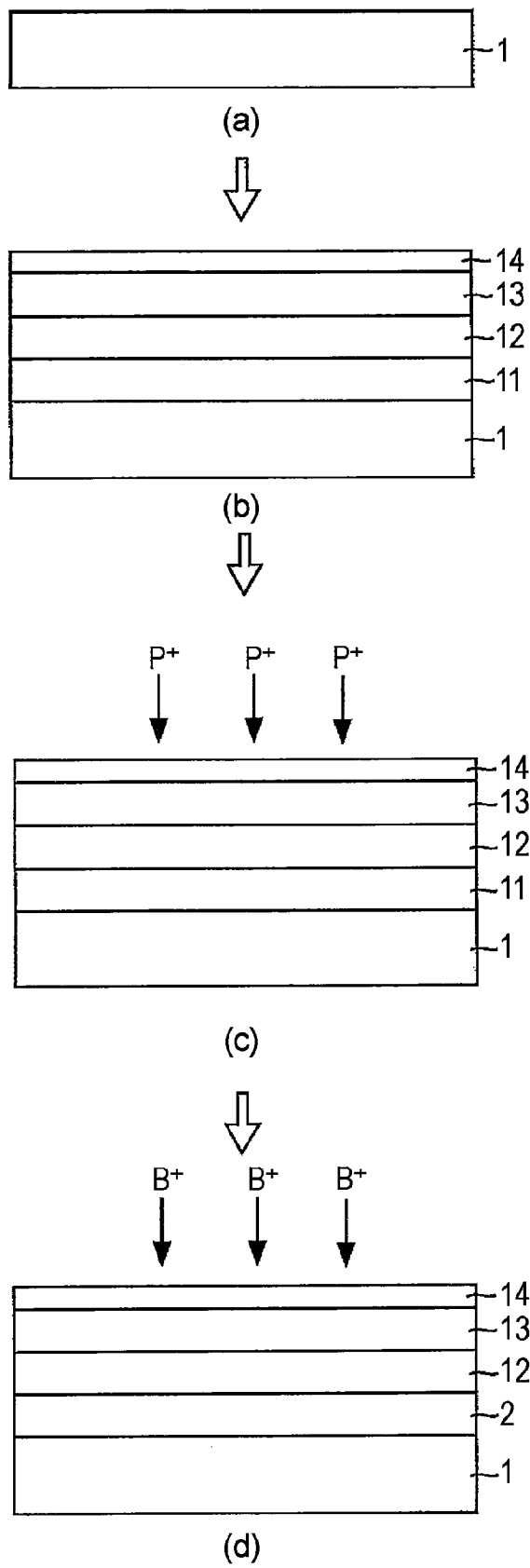
FIG. 6 is a first process diagram for describing a method for manufacturing the light-emitting device shown in FIG. 1.
Figure 7:
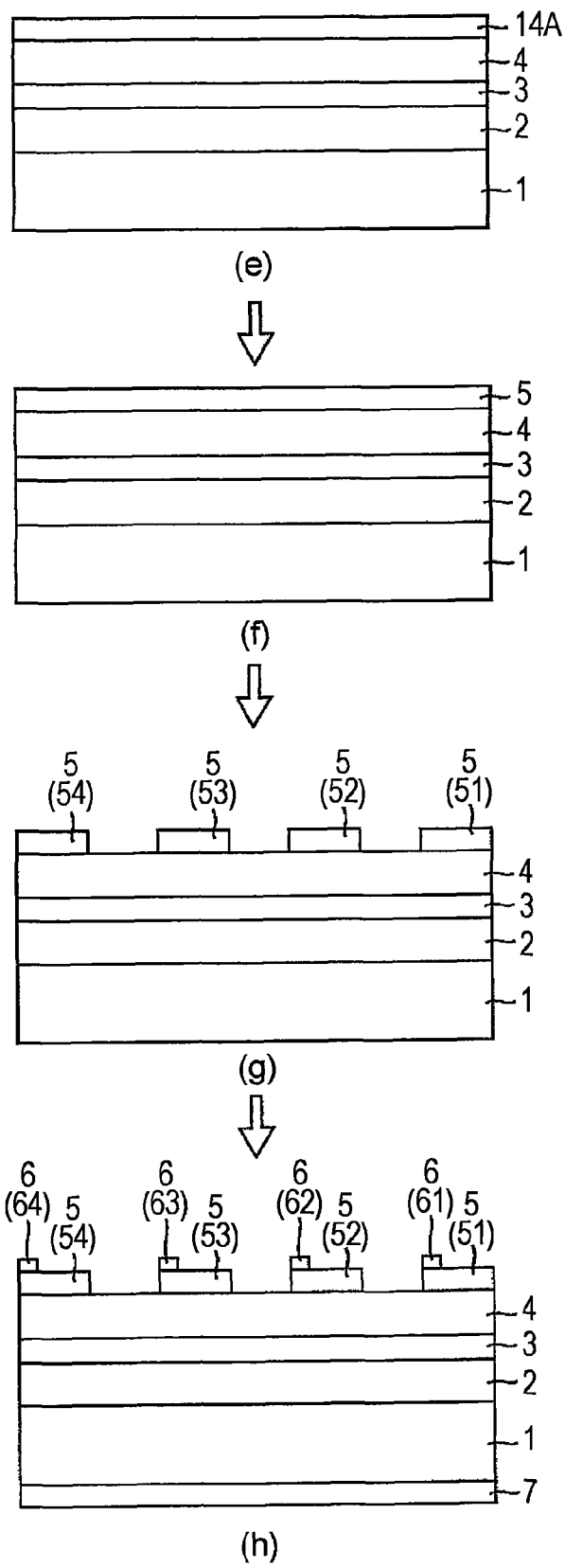
FIG. 7 is a second process diagram for describing a method for manufacturing the light-emitting device shown in FIG. 1.

FIGS. 6 and 7 are respectively a first process diagram and a second process diagram for describing a method for manufacturing the light-emitting device 10 shown in FIG. 1. Referring to FIG. 6, in the manufacturing of the light-emitting device 10, the substrate 1 made of $n^+$ Si is prepared (refer to a step (a)), cleaned, and placed on the sample holder 103 of the plasma CVD apparatus 100.

A silicon thin film 11 containing an oxygen element (O) and a larger amount of Si than $SiO_2$ is deposited on one principal surface of the substrate 1 under the reaction conditions shown in Table 1.

TABLE 1

| | |
|---|---|
| Flow rate of $SiH_4$ (10%, diluted with $H_2$) | 89 sccm |
| Flow rate of $N_2O$ (100%) | 29 sccm |
| Pressure | 133 Pa |
| RF power | 0.32 W/cm² |
| Substrate temperature | 300° C. |
| Reaction time | 3 minutes |

A silicon thin film 12 containing a nitrogen element (N) and a larger amount of Si than $Si_3N_4$ is then deposited on the silicon thin film 11 under the reaction conditions shown in Table 2.

TABLE 2

| | |
|---|---|
| Flow rate of $SiH_4$ (10%, diluted with $H_2$) | 100 sccm |
| Flow rate of $NH_3$ (100%) | 20 sccm |
| Pressure | 133 Pa |
| RF power | 0.32 W/cm² |
| Substrate temperature | 300° C. |
| Reaction time | 4 minutes |

A silicon thin film 13 containing an oxygen element (O), a nitrogen element (N), and a larger amount of Si than $SiO_2$ and $Si_3N_4$ is then deposited on the silicon thin film 12 under the reaction conditions shown in Table 3.

TABLE 3

| | |
|---|---|
| Flow rate of $SiH_4$ (10%, diluted with $H_2$) | 96 sccm |
| Flow rate of $N_2O$ (100%) | 6 sccm |
| Flow rate of $NH_3$ (100%) | 18 sccm |
| Pressure | 133 Pa |
| RF power | 0.32 W/cm² |
| Substrate temperature | 300° C. |
| Reaction time | 4 minutes |

Subsequently, an amorphous silicon (a-Si) film 14 is deposited on the silicon thin film 13 using the reaction conditions shown in Table 3 under which the $N_2O$ gas and the $NH_3$ gas are stopped (refer to a step (b) in FIG. 6).

Phosphorus ions ($P^+$) are then injected into the silicon thin film 11 by ion implantation (refer to a step (c) in FIG. 6). In this case, the acceleration voltage of ion implantation is adjusted such that the $P^+$ ions are injected into only the silicon thin film 11. Thus, an n-type silicon thin film 2 is formed (refer to a step (d) in FIG. 6).

Boron ions ($B^+$) are then injected into the silicon thin film 13 and the a-Si film 14 by ion implantation (refer to a step (d) in FIG. 6). In this case, the acceleration voltage of ion implantation is adjusted such that the $B^+$ ions are injected into the silicon thin film 13 and the a-Si film 14. Thus, a p-type silicon thin film 4 and a p-type a-Si film 14A are formed (refer to a step (e) in FIG. 7).

The resultant substrate 1/n-type silicon thin film 2/silicon thin film 3/p-type silicon thin film 4/p-type a-Si film 14A is annealed under the conditions shown in Table 4.

TABLE 4

| | |
|---|---|
| Annealing temperature | 1000° C. |
| Annealing atmosphere | nitrogen atmosphere |
| Pressure | atmospheric pressure |
| Annealing time | 1 hour |

As a result, P atoms injected into the n-type silicon thin film 2 and B atoms injected into the p-type silicon thin film 4 by ion implantation are electrically activated. Furthermore, the p-type a-Si film 14A is converted to a p+ poly-Si film 5 (refer to a step (f) in FIG. 7).

The p+ poly-Si film 5 is patterned into p+ poly-Si films 51 to 54 by photolithography (refer to a step (g) in FIG. 7).

After that, electrodes 6 (61 to 64) are formed on the p+ poly-Si films 51 to 54 by sputtering Al, respectively. Then, an electrode 7 is formed on the back surface of the substrate 1 (refer to a step (h) in FIG. 7). Accordingly, the light-emitting device 10 is completed.

As described above, the silicon thin film 11 including quantum dots is formed using the reaction conditions shown in Table 1, the silicon thin film 12 including quantum dots is formed using the reaction conditions shown in Table 2, and the silicon thin film 13 including quantum dots is formed using the reaction conditions shown in Table 3. Therefore, the silicon thin film 11 including quantum dots, the silicon thin film 12 including quantum dots, and the silicon thin film 13 including quantum dots can be formed in a single film formation.

The flow rate ratio of the $SiH_4$ gas to the $N_2O$ gas under the above-mentioned conditions (Table 1) under which the silicon thin film 11 is formed is higher than the flow rate ratio (standard flow rate ratio) of the $SiH_4$ gas to the $N_2O$ gas used to form a $SiO_2$ film as an insulating film. In other words, the silicon thin film 11 is formed with a flow rate of the $SiH_4$ gas higher than that of the standard in the present invention. Therefore, the silicon thin film 11 is called a silicon-rich oxide film.

The flow rate ratio of the $SiH_4$ gas to the $NH_3$ gas under the above-mentioned conditions (Table 2) under which the silicon thin film 12 is formed is higher than the flow rate ratio (standard flow rate ratio) of the $SiH_4$ gas to the $NH_3$ gas used to form a $Si_3N_4$ film as an insulating film. In other words, the silicon thin film 12 is formed with a flow rate of the $SiH_4$ gas higher than that of the standard in the present invention. Therefore, the silicon thin film 12 is called a silicon-rich nitride film.

The flow rate ratio of the $SiH_4$ gas to the $N_2O$ gas and the $NH_3$ gas under the above-mentioned conditions (Table 3) under which the silicon thin film 13 is formed is higher than the flow rate ratio (standard flow rate ratio) of the $SiH_4$ gas to the $N_2O$ gas and the $NH_3$ gas used to form a $SiO_xN_{(4/3-2x/3)}$ (0<x<2) film as an insulating film. In other words, the silicon thin film 13 is formed with a flow rate of the $SiH_4$ gas higher than that of the standard in the present invention. Therefore, the silicon thin film 13 is called a silicon-rich oxynitride film.

Accordingly, in the present invention, the silicon thin film 11 including quantum dots composed of Si dots is formed using the conditions under which the silicon-rich oxide film is formed. The silicon thin film 12 including quantum dots composed of Si dots is formed using the conditions under which the silicon-rich nitride film is formed. The silicon thin film 13 including quantum dots composed of Si dots is formed using the conditions under which the silicon-rich oxynitride film is formed.

To increase the densities of quantum dots 21 included in the n-type silicon thin film 2, quantum dots 31 included in the silicon thin film 3, and quantum dots 41 included in the p-type silicon thin film 4, the flow rate ratio of the $SiH_4$ gas to the $N_2O$ gas and the $NH_3$ gas is relatively increased and the heat treatment time in the step (e) in FIG. 7 is shortened to about a few seconds.

To decrease the densities of quantum dots 21 included in the n-type silicon thin film 2, quantum dots 31 included in the silicon thin film 3, and quantum dots 41 included in the p-type silicon thin film 4, the flow rate ratio of the $SiH_4$ gas to the $N_2O$ gas and the $NH_3$ gas is relatively decreased and the heat treatment time in the step (e) in FIG. 7 is lengthened to several tens of minutes or more.

As described above, the densities of the quantum dots 21 included in the n-type silicon thin film 2, the quantum dots 31 included in the silicon thin film 3, and the quantum dots 41 included in the p-type silicon thin film 4 can be controlled with the flow rate ratio of the $SiH_4$ gas to the $N_2O$ gas and the $NH_3$ gas and with the heat treatment time in the step (e) in FIG. 7.

In the method for manufacturing the light-emitting device 10 shown in FIGS. 6 and 7, it has been described that, after the silicon thin film 11 including quantum dots, the silicon thin film 12 including quantum dots, and the silicon thin film 13 including quantum dots are formed by plasma CVD, the P+ ions and the B+ ions are respectively injected into the silicon thin film 11 and the silicon thin film 13 by ion implantation to form the n-type silicon thin film 2 and the p-type silicon thin film 4. However, the present invention is not limited to this method. The n-type silicon thin film 2 and the p-type silicon thin film 4 may be formed by plasma CVD.

In this case, the n-type silicon thin film 2 is formed by plasma CVD using a $PH_3$ gas as a source gas of P and the p-type silicon thin film 4 is formed using a $B_2H_6$ gas as a source gas of B.

The reaction conditions under which the n-type silicon thin film 2 is formed are specified by adding a flow rate of the $PH_3$ gas to the reaction conditions shown in Table 1. The reaction conditions under which the p-type silicon thin film 4 is formed are specified by adding a flow rate of the $B_2H_6$ gas to the reaction conditions shown in Table 3.

Furthermore, although it has been described that the n-type silicon thin film 2 is formed using P in the above description, the present invention is not limited to this. The n-type silicon thin film 2 may be formed using arsenic (As). In this case, As ions are injected into only the n-type silicon thin film 11 by ion implantation in the step (c) in FIG. 6. When the n-type silicon thin film 2 is formed by plasma CVD using As, an $AsH_3$ gas is used as a source gas of As.

Figure 8:
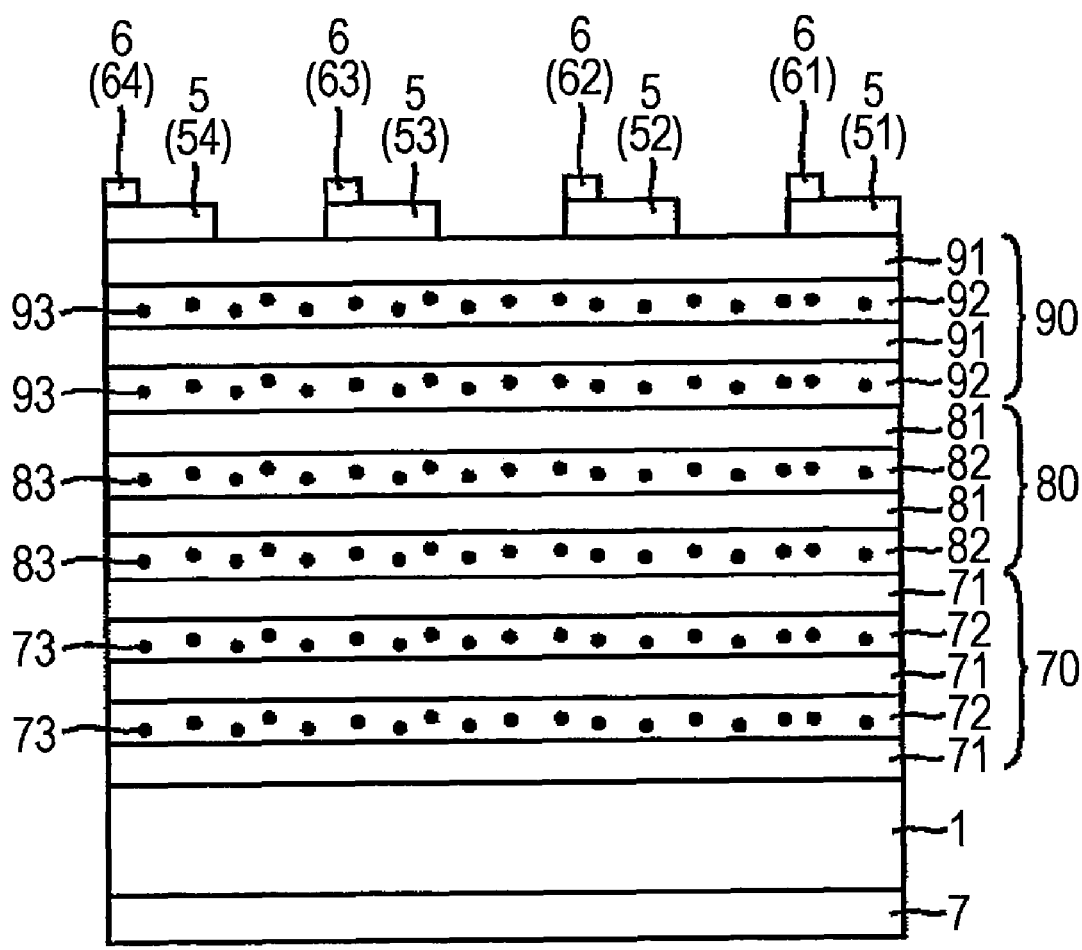
FIG. 8 is a sectional view of another light-emitting device according to an embodiment of the present invention.

FIG. 8 is a sectional view of another light-emitting device according to an embodiment of the present invention. A light-emitting device according to the present invention may be a light-emitting device 10A shown in FIG. 8. Referring to FIG. 8, the light-emitting device 10A is the same as the light-emitting device 10 shown in FIG. 1 except that the n-type silicon thin film 2, the silicon thin film 3, and the p-type silicon thin film 4 of the light-emitting device 10 are replaced with a silicon thin film 70, a silicon thin film 80, and a silicon thin film 90, respectively.

The silicon thin film 70 is formed on the substrate 1. The silicon thin film 80 is formed on the silicon thin film 70. The silicon thin film 90 is formed on the silicon thin film 80.

The silicon thin film 70 includes a plurality of $SiO_2$ films 71 and a plurality of n-type silicon thin films 72. The plurality of $SiO_2$ films 71 and the plurality of n-type silicon thin films 72 are alternately stacked in a thickness direction. Each of the plurality of n-type silicon thin films 72 includes a silicon oxide film and a plurality of n-type Si dots 73 irregularly arranged in a thickness direction. Each of the plurality of $SiO_2$ films 71 has a thickness of 1 to 5 nm and each of the plurality of n-type silicon thin films 72 has a thickness of 3 to 10 nm.

The silicon thin film 80 includes a plurality of $Si_3N_4$ films 81 and a plurality of silicon thin films 82. The plurality of $Si_3N_4$ films 81 and the plurality of silicon thin films 82 are alternately stacked in a thickness direction. Each of the plurality of silicon thin films 82 includes a silicon nitride film and a plurality of Si dots 83 irregularly arranged in a thickness direction. Each of the plurality of $Si_3N_4$ films 81 has a thickness of 1 to 5 nm and each of the plurality of silicon thin films 82 has a thickness of 3 to 10 nm.

The silicon thin film 90 includes a plurality of $SiO_xN_{(4/3-2x/3)}$ ($0<x<2$) films 91 and a plurality of p-type silicon thin films 92. The plurality of $SiO_xN_{(4/3-2x/3)}$ ($0<x<2$) films 91 and the plurality of p-type silicon thin films 92 are alternately stacked in a thickness direction. Each of the plurality of p-type silicon thin films 92 includes a silicon oxynitride film and a plurality of p-type Si dots 93 irregularly arranged in a thickness direction. Each of the plurality of $SiO_xN_{(4/3-2x/3)}$ ($0<x<2$) films 91 has a thickness of 1 to 5 nm and each of the plurality of p-type silicon thin films 92 has a thickness of 3 to 10 nm.

Each of the plurality of n-type Si dots 73 has a P concentration that is substantially the same as the P concentration in each of the quantum dots 21. Each of the plurality of p-type Si dots 93 has a B concentration that is substantially the same as the B concentration in each of the quantum dots 31.

As described above, the light-emitting device 10A has a structure in which the $SiO_2$ films 71 not including dopants sandwich each of the n-type silicon thin films 72, the $Si_3N_4$ films 81 not including dopants sandwich each of the silicon thin films 82, and the $SiO_xN_{(4/3-2x/3)}$ ($0<x<2$) films 91 not including dopants sandwich each of the p-type silicon thin films 92. Accordingly, the light-emitting device according to the present invention may have a structure in which insulators ($SiO_2$ films 71, $Si_3N_4$ films 81, or $SiO_xN_{(4/3-2x/3)}$ ($0<x<2$) films 91) not including dopants sandwich quantum dots (n-type Si dots 73, Si dots 83, or p-type Si dots 93).

Figure 9:
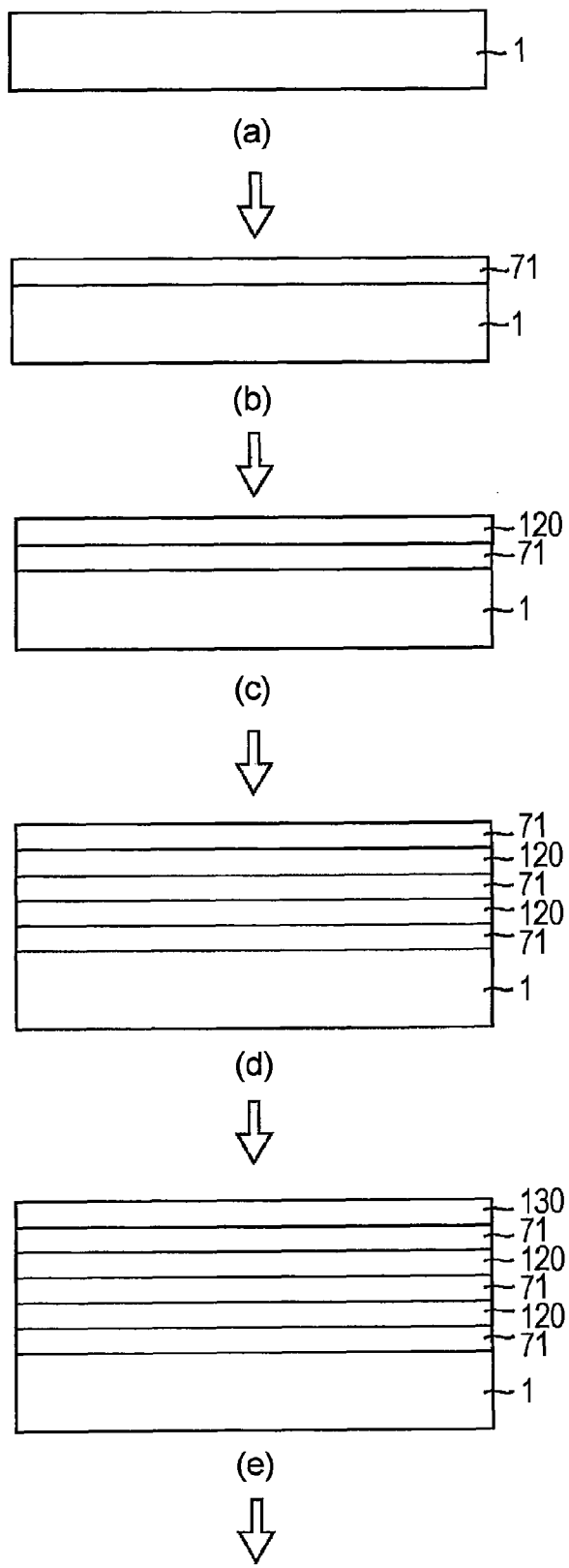
FIG. 9 is a first process diagram for describing a method for manufacturing a semiconductor device shown in FIG. 8.
Figure 14:
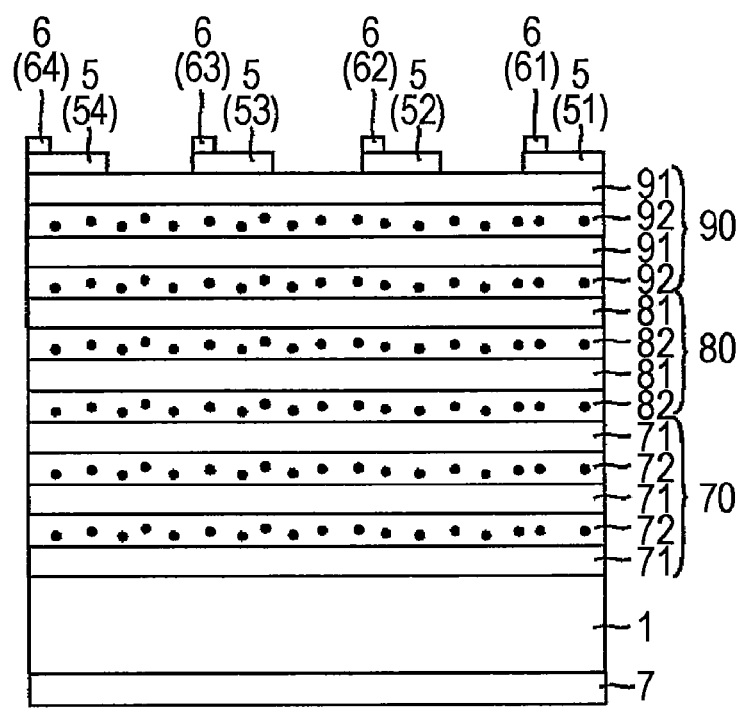
FIG. 14 is a sixth process diagram for describing a method for manufacturing the semiconductor device shown in FIG. 8.

Next, a method for manufacturing the light-emitting device 10A will be described. FIGS. 9 to 14 are respectively first to sixth process diagrams for describing a method for manufacturing the light-emitting device 10A shown in FIG. 8. Referring to FIG. 9, in the manufacturing of the light-emitting device 10A, a substrate 1 is prepared (refer to a step (a)) and cleaned, and a $SiO_2$ film 71 is formed on the entire surface of the substrate 1 by plasma CVD using a $SiH_4$ gas and a $N_2O$ gas as raw material gases (refer to a step (b)). In this case, the $SiO_2$ film 71 is formed under the reaction conditions shown in Table 1 with a $SiH_4$ gas flow rate of 86 sccm and a $N_2O$ gas flow rate of 200 sccm.

Subsequently, a silicon thin film 120 containing an oxygen element (O) and a larger amount of Si than $SiO_2$ is deposited on the $SiO_2$ film 71 by plasma CVD using the $SiH_4$ gas and the $N_2O$ gas as raw materials under the reaction conditions shown in Table 1 (refer to a step (c) in FIG. 9).

By repeating the steps (b) and (c), a plurality of $SiO_2$ films 71 and a plurality of silicon thin films 120 are alternately formed on the substrate 1 (refer to a step (d) in FIG. 9).

After that, a silicon thin film 130 containing a nitrogen element (N) and a larger amount of Si than $Si_3N_4$ is deposited on the top layer of the $SiO_2$ films 71 by plasma CVD using the $SiH_4$ gas and an $NH_3$ gas as raw materials under the reaction conditions shown in Table 2 (refer to a step (e) in FIG. 9).

A $Si_3N_4$ film 81 is deposited on the silicon thin film 130 by plasma CVD using the $SiH_4$ gas and the $NH_3$ gas as raw materials (refer to a step (f) in FIG. 10). In this case, the $Si_3N_4$ film 81 is formed under the reaction conditions shown in Table 2 with a $SiH_4$ gas flow rate of 92 sccm and an $NH_3$ gas flow rate of 150 sccm. By repeating the steps (e) and (f), a plurality of $Si_3N_4$ films 81 and a plurality of silicon thin films 130 are alternately formed on the top layer of the $SiO_2$ films 71.

A silicon thin film 140 is then deposited on the top layer of the $Si_3N_4$ film 81 by plasma CVD under the reaction conditions shown in Table 3 using the $SiH_4$ gas, the $N_2O$ gas, and the $NH_3$ gas as raw materials (refer to a step (g) in FIG. 10).

A $SiO_xN_{(4/3-2x/3)}$ ($0<x<2$) film 91 is deposited on the silicon thin film 140 by plasma CVD using the $SiH_4$ gas, the $N_2O$ gas, and the $NH_3$ gas as raw materials (refer to a step (h) in FIG. 10). In this case, the $SiO_xN_{(4/3-2x/3)}$ ($0<x<2$) film 91 is formed under the reaction conditions shown in Table 3 with a $SiH_4$ gas flow rate of 96 sccm, an $NH_3$ gas flow rate of 150 sccm, and a $N_2O$ gas flow rate of 150 sccm. By repeating the steps (g) and (h), a plurality of $SiO_xN_{(4/3-2x/3)}$ ($0<x<2$) films 91 and a plurality of silicon thin films 140 are alternately formed on the top layer of the $Si_3N_4$ film 81.

Subsequently, an a-Si film 14 is deposited on the top layer of the $SiO_xN_{(4/3-2x/3)}$ ($0<x<2$) films 91 using the reaction conditions shown in Table 3 under which the $NH_3$ gas and the $N_2O$ gas are stopped (refer to a step (i) in FIG. 11).

$P^+$ ions are then injected into the silicon thin films 120 by ion implantation (refer to a step (j) in FIG. 11). In this case, the acceleration voltage of ion implantation is adjusted such that the $P^+$ ions are injected into only the plurality of silicon thin films 120. Thus, a plurality of n-type silicon thin films 72 are formed (refer to a step (k) in FIG. 12).

$B^+$ ions are then injected into the silicon thin films 130 and the a-Si film 14 by ion implantation (refer to a step (k) in FIG. 12). In this case, the acceleration voltage of ion implantation is adjusted such that the $B^+$ ions are injected into the plurality of silicon thin films 130 and the a-Si film 14. Thus, a plurality of p-type silicon thin films 82, a plurality of silicon thin films 92, and a p-type a-Si film 14A are formed (refer to a step (l) in FIG. 12).

The resultant substrate 1/$SiO_2$ film 71/silicon thin film 72/ . . . /$SiO_2$ film 71/silicon thin film 82/$Si_3N_4$ film 81/ . . . /$Si_3N_4$ film 81/p-type silicon thin film 92/$SiO_xN_{(4/3-2x/3)}$ ($0<x<2$) film 91/ . . . /$SiO_xN_{(4/3-2x/3)}$ ($0<x<2$) film 91/p-type a-Si film 14A is annealed under the conditions shown in Table 4.

As a result, P atoms injected into the n-type silicon thin films 72 and B atoms injected into the p-type silicon thin films 92 are electrically activated. Furthermore, the p-type a-Si film 14A is converted to a $p^+$ poly-Si film 5 (refer to a step (m) in FIG. 13).

The $p^+$ poly-Si film 5 is then patterned into $p^+$ poly-Si films 51 to 54 by photolithography (refer to a step (n) in FIG. 13).

After that, electrodes 6 (61 to 64) are formed on the $p^+$ poly-Si films 51 to 54 by sputtering Al, respectively. Then, an electrode 7 is formed on the back surface of the substrate 1 (refer to a step (p) in FIG. 14). Thus, the light-emitting device 10A is completed.

An energy band diagram of the light-emitting device 10A shown in FIG. 8 at zero bias is the same as that shown in FIG. 3. An energy band diagram of the light-emitting device 10A shown in FIG. 8 when an electric current is applied is the same as that shown in FIG. 4. Consequently, the light-emitting device 10A emits light through the same mechanism as that of the light-emitting device 10 described above.

Accordingly, light-emitting efficiency can also be increased in the light-emitting device 10A.

Figure 15:
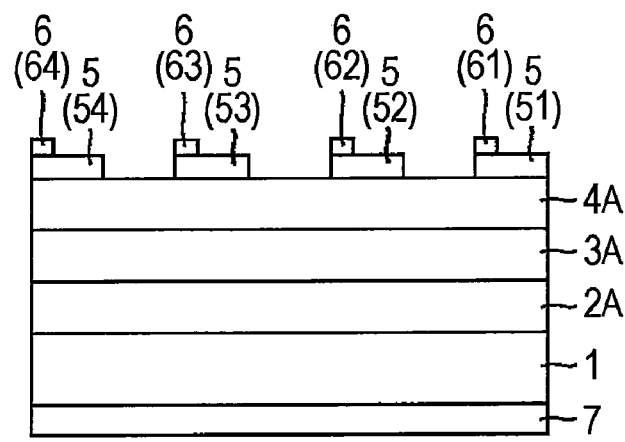
FIG. 15 is a sectional view of still another light-emitting device according to an embodiment of the present invention.

FIG. 15 is a sectional view of still another light-emitting device according to an embodiment of the present invention. A light-emitting device according to an embodiment of the present invention may be a light-emitting device 10B shown in FIG. 15. Referring to FIG. 15, the light-emitting device 10B is the same as the light-emitting device 10 shown in FIG. 1 except that the n-type silicon thin film 2 of the light-emitting device 10 is replaced with a germanium thin film 2A containing a larger amount of germanium than $GeO_2$, and into which n-type impurities are introduced; the silicon thin film 3 is replaced with a germanium thin film 3A containing a larger amount of germanium than $Ge_3N_4$; and the p-type silicon thin film 4 is replaced with a p-type germanium thin film 4A containing a larger amount of germanium than $GeO_xN_{(4/3-2x/3)}$ ($0<x<2$), and into which p-type impurities are introduced.

The n-type germanium thin film 2A has a composition in which silicon of the n-type silicon thin film 2 is replaced with germanium and has the same thickness as that of the n-type silicon thin film 2.

The germanium thin film 3A has a composition in which silicon of the silicon thin film 3 is replaced with germanium and has the same thickness as that of the silicon thin film 3.

The p-type germanium thin film 4A has a composition in which silicon of the p-type silicon thin film 4 is replaced with germanium and has the same thickness as that of the p-type silicon thin film 4.

Therefore, the n-type germanium thin film 2A is formed using the reaction conditions shown in Table 1 under which the $SiH_4$ gas is replaced with the $GeH_4$ gas. The germanium thin film 3A is formed using the reaction conditions shown in Table 2 under which the $SiH_4$ gas is replaced with the $GeH_4$ gas. The p-type germanium thin film 4A is formed using the reaction conditions shown in Table 3 under which the $SiH_4$ gas is replaced with the $GeH_4$ gas.

The light-emitting device 10B is manufactured in accordance with the steps (a) to (h) shown in FIGS. 6 and 7.

An energy band diagram of the light-emitting device 10B at zero bias is the same as that shown in FIG. 3. An energy band diagram of the light-emitting device 10B when an electric current is applied is the same as that shown in FIG. 4.

Thus, the light-emitting device 10B has high light-emitting efficiency as well as the light-emitting device 10.

Figure 16:
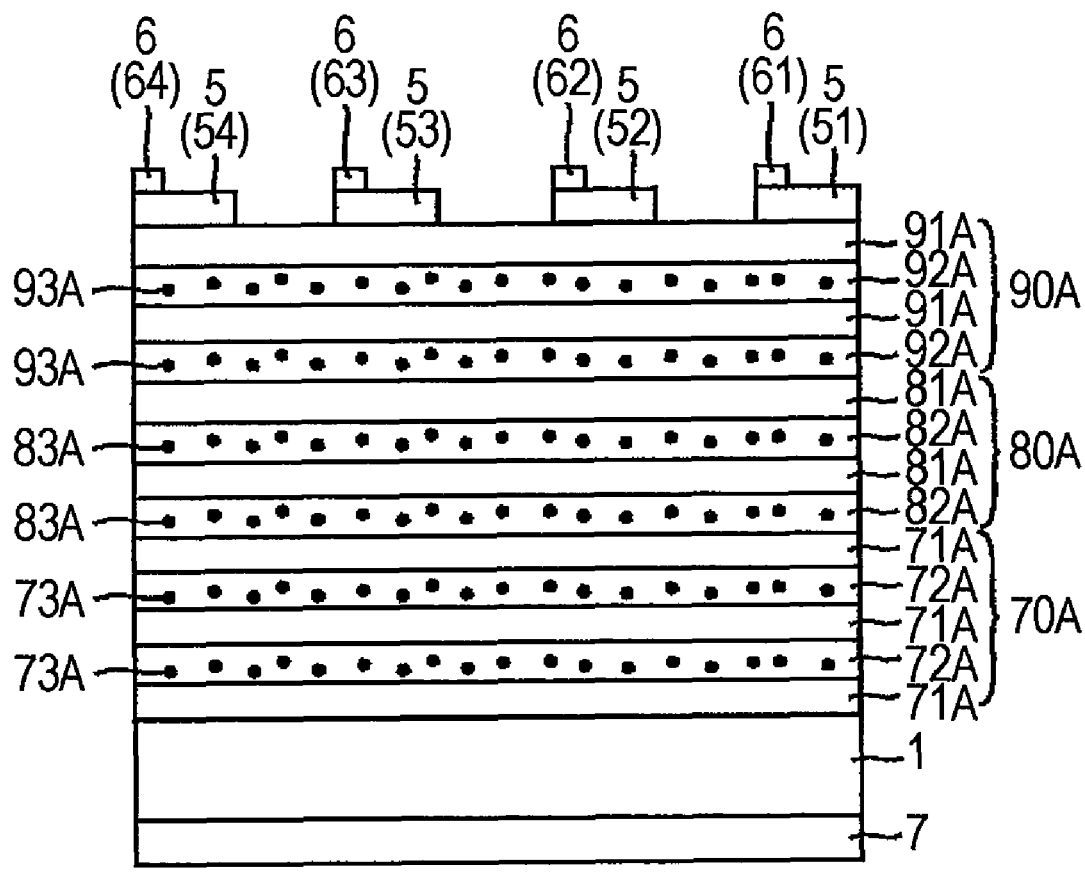
FIG. 16 is a sectional view of still yet another light-emitting device according to an embodiment of the present invention.

FIG. 16 is a sectional view of still yet another light-emitting device according to an embodiment of the present invention. A light-emitting device according to an embodiment of the present invention may be a light-emitting device 10C shown in FIG. 16. Referring to FIG. 16, the light-emitting device 10C is the same as the light-emitting device 10A shown in FIG. 8 except that the silicon thin film 70 of the light-emitting device 10A is replaced with a germanium thin film 70A, the silicon thin film 80 is replaced with a germanium thin film 80A, and the silicon thin film 90 is replaced with a germanium thin film 90A.

The germanium thin film 70A includes a plurality of $GeO_2$ films 71A and a plurality of n-type germanium thin films 72A. The plurality of $GeO_2$ films 71A and the plurality of n-type germanium thin films 72A are alternately stacked in a thickness direction. Each of the plurality of n-type germanium thin films 72A includes a germanium oxide film and a plurality of n-type Ge dots 73A irregularly arranged in a thickness direction. Each of the plurality of $GeO_2$ films 71A has a thickness of 1 to 5 nm and each of the plurality of n-type germanium thin films 72A has a thickness of 3 to 10 nm.

The germanium nitride film 80A includes a plurality of $Ge_3N_4$ films 81A and a plurality of germanium thin films 82A. The plurality of $Ge_3N_4$ films 81A and the plurality of germanium thin films 82A are alternately stacked in a thickness direction. Each of the plurality of germanium thin films 82A includes a germanium nitride film and a plurality of p-type Ge dots 83A irregularly arranged in a thickness direction. Each of the plurality of $Ge_3N_4$ films 81A has a thickness of 1 to 5 nm and each of the plurality of germanium thin films 82A has a thickness of 3 to 10 nm.

The germanium thin film 90A includes a plurality of $GeO_xN_{(4/3-2x/3)}$ ($0<x<2$) films 91A and a plurality of p-type germanium thin films 92A. The plurality of $GeO_xN_{(4/3-2x/3)}$ ($0<x<2$) films 91A and the plurality of p-type germanium thin films 92A are alternately stacked in a thickness direction. Each of the plurality of p-type germanium thin films 92A includes a germanium oxynitride film and a plurality of p-type Ge dots 93A irregularly arranged in a thickness direction. Each of the plurality of $GeO_xN_{(4/3-2x/3)}$ ($0<x<2$) films 91A has a thickness of 1 to 5 nm and each of the plurality of p-type germanium thin films 92A has a thickness of 3 to 10 nm.

Each of the plurality of n-type Ge dots 73A has a P concentration that is substantially the same as the P concentration in each of the quantum dots 73. Each of the plurality of p-type Ge dots 93A has a B concentration that is substantially the same as the B concentration in each of the quantum dots 93.

As described above, the light-emitting device 10C has a structure in which the $GeO_2$ films 71A not including dopants sandwich each of the n-type germanium thin films 72A, the $Ge_3N_4$ films 81A not including dopants sandwich each of the germanium thin films 82A, and the $GeO_xN_{(4/3-2x/3)}$ ($0<x<2$) films 91 not including dopants sandwich each of the p-type germanium thin films 92A. Accordingly, the light-emitting device according to the present invention may have a structure in which insulators ($GeO_2$ films 71A, $Ge_3N_4$ films 81A, or $GeO_xN_{(4/3-2x/3)}$ ($0<x<2$) films 91A) not including dopants sandwich quantum dots (n-type Ge dots 73A, Ge dots 83A, or p-type Ge dots 93A).

The light-emitting device according to the present invention needs only to include a light-emitting layer emitting light by recombination of electrons and holes, a first conductive member supplying electrons to the light-emitting layer through n-type quantum dots, and a second conductive member supplying holes to the light-emitting layer through p-type quantum dots. This is because the first and second conductive members respectively supplying electrons and holes to the light-emitting layer can contribute to an increase in light-emitting efficiency at the light-emitting layer.

The light-emitting device according to the present invention may be a light-emitting device composed of an oxide film, a nitride film, and an oxynitride film containing an element constituting an organic semiconductor, instead of silicon and germanium described above.

In the present invention, each of the n-type silicon thin films 2 and 2A constitutes "a first conductive member". Each of the silicon thin films 3 and 3A constitutes "a second conductive member". Each of the p-type silicon thin films 4 and 4A constitutes "a third conductive member".

In the present invention, each of the n-type silicon thin films 2 and 2A constitutes "a first conductive member". Each of the silicon thin films 3 and 3A constitutes "a light-emitting layer". Each of the p-type silicon thin films 4 and 4A constitutes "a second conductive member".

In the present invention, each of the silicon thin films 70 and 70A constitutes "a first conductive member". Each of the silicon thin films 80 and 80A constitutes "a second conductive member". Each of the silicon thin films 90 and 90A constitutes "a third conductive member".

In the present invention, each of the silicon thin films 70 and 70A constitutes "a first conductive member". Each of the silicon thin films 80 and 80A constitutes "a light-emitting layer". Each of the silicon thin films 90 and 90A constitutes "a second conductive member".

In the present invention, each of the quantum dots 21 and 73 constitutes "a first quantum dot". Each of the quantum dots 31 and 83 constitutes "a second quantum dot". Each of the quantum dots 41 and 93 constitutes "a third quantum dot".

In the present invention, the quantum dot 73A constitutes "a first quantum dot", the quantum dot 83A constitutes "a second quantum dot", and the quantum dot 93A constitutes "a third quantum dot".

It should be considered that the embodiments disclosed in this entire specification are mere examples and do not limit the present invention. The scope of the present invention is specified by Claims but not by the descriptions of the above-mentioned embodiments, and any modification can be made within the scope and spirit of Claims.

INDUSTRIAL APPLICABILITY

The present invention is applied to a light-emitting device whose light-emitting efficiency can be improved. The present invention is also applied to a method for manufacturing the light-emitting device whose light-emitting efficiency can be improved.

The invention claimed is:

1. A light-emitting device comprising:
a first conductive member including a first quantum dot of a first conduction type;
a second conductive member including a second quantum dot, and being disposed on the first conductive member; and
a third conductive member including a third quantum dot of a second conduction type that is different from the first conduction type, being disposed on the second conductive member and having a higher barrier energy against electrons than the second conductive member.

2. The light-emitting device according to claim 1,
wherein the first conductive member includes a plurality of the first quantum dots and a first insulating layer in which a tunneling current flows;
the second conductive member includes a plurality of the second quantum dots and a second insulating layer in which a tunneling current flows; and
the third conductive member includes a plurality of the third quantum dots and a third insulating layer in which a tunneling current flows.

3. The light-emitting device according to claim 2,
wherein the plurality of first quantum dots are irregularly arranged in a thickness direction of the first conductive member;
the plurality of second quantum dots are irregularly arranged in a thickness direction of the second conductive member; and
the plurality of third quantum dots are irregularly arranged in a thickness direction of the third conductive member.

4. The light-emitting device according to claim 1, wherein the first conduction type is an n-type and the second conduction type is a p-type.

5. The light-emitting device according to claim 4,
wherein, in the first conductive member, a barrier energy against holes is higher than a barrier energy against electrons; and
in the third conductive member, a barrier energy against electrons is higher than a barrier energy against holes.

6. The light-emitting device according to claim 5,
wherein the first, second, and third quantum dots are composed of silicon dots;
the first conductive member is composed of a silicon oxide film containing a larger amount of silicon than $SiO_2$;
the second conductive member is composed of a silicon nitride film containing a larger amount of silicon than $Si_3N_4$; and
the third conductive member is composed of a silicon oxynitride film containing a larger amount of silicon than $SiO_xN_{(4/3-2x/3)}$ ($0<x<2$).

7. A light-emitting device comprising:
a light-emitting layer including a quantum dot;
a first conductive member supplying an electron to the light-emitting layer through an n-type quantum dot; and
a second conductive member supplying a hole to the light-emitting layer through a p-type quantum dot.

8. The light-emitting device according to claim 7,
wherein the first conductive member is composed of a silicon oxide film containing a larger amount of silicon than $SiO_2$; and
the second conductive member is composed of a silicon oxynitride film containing a larger amount of silicon than $SiO_xN_{(4/3-2x/3)}$ ($0<x<2$).

9. A method for manufacturing a light-emitting device comprising:
a first step of depositing a first conductive member including a quantum dot on one principal surface of a semiconductor substrate;
a second step of depositing a second conductive member including a quantum dot on the first conductive member;
a third step of depositing a third conductive member including a quantum dot on the second conductive member;
a fourth step of introducing an impurity of a first conduction type into the first conductive member;
a fifth step of introducing an impurity of a second conduction type that is different from the first conduction type into the third conductive member; and
a sixth step of heat-treating the first conductive member including the impurity of the first conduction type and the third conductive member including the impurity of the second conduction type.

10. The method for manufacturing a light-emitting device according to claim 9,
wherein, in the first step, the first conductive member composed of a silicon oxide film containing a larger amount of silicon than $SiO_2$ is deposited on the principal surface by adjusting a flow rate ratio of a second material gas including silicon to a first material gas including oxygen to a first standard flow rate ratio or more;
in the second step, the second conductive member composed of a silicon nitride film containing a larger amount of silicon than $Si_3N_4$ is deposited on the first conductive member by adjusting a flow rate ratio of the second material gas to a third material gas including nitrogen to a second standard flow rate ratio or more; and
in the third step, the third conductive member composed of a silicon oxynitride film containing a larger amount of silicon than $SiO_xN_{(4/3-2x/3)}$ ($0<x<2$) is deposited on the second conductive member by adjusting a flow rate ratio of the second material gas to the first material gas to the first standard flow rate ratio or more and by adjusting a flow rate ratio of the second material gas to the third material gas to the second standard flow rate ratio or more.

11. The method for manufacturing a light-emitting device according to claim 10, wherein, in the fourth step, an n-type impurity is introduced into the first conductive member; and in the fifth step, a p-type impurity is introduced into the third conductive member.

12. The method for manufacturing a light-emitting device according to claim 11, wherein, in the sixth step, the first conductive member including the n-type impurity and the third conductive member including the p-type impurity are heat-treated in a nitrogen atmosphere.

* * * * *